(12) United States Patent
Li et al.

(10) Patent No.: US 6,788,142 B2
(45) Date of Patent: Sep. 7, 2004

(54) WIDE COMMON MODE DIFFERENTIAL INPUT AMPLIFIER AND METHOD

(75) Inventors: Ning Li, Fremont, CA (US); Jiann-Chyi Shieh, San Jose, CA (US)

(73) Assignee: Broadcom Corporation, Irvine, CA (US)

(*) Notice: Subject to any disclaimer, the term of this patent is extended or adjusted under 35 U.S.C. 154(b) by 101 days.

(21) Appl. No.: 10/101,056

(22) Filed: Mar. 20, 2002

(65) Prior Publication Data

US 2003/0095003 A1 May 22, 2003

Related U.S. Application Data

(60) Provisional application No. 60/331,522, filed on Nov. 19, 2001.

(51) Int. Cl.[7] .................................................. H03F 3/45
(52) U.S. Cl. ..................................... 330/253; 330/258
(58) Field of Search .......................... 330/253, 258, 330/310, 311

(56) References Cited

U.S. PATENT DOCUMENTS

| | | | |
|---|---|---|---|
| 5,767,698 A | 6/1998 | Emeigh et al. | 326/53 |
| 6,118,438 A | 9/2000 | Ho | 345/204 |
| 6,252,435 B1 | 6/2001 | Wu et al. | 327/65 |
| 6,275,107 B1 | 8/2001 | Maeda et al. | 330/253 |
| 6,525,607 B1 * | 2/2003 | Liu | 330/253 |

OTHER PUBLICATIONS

"LVDS I/O Interface of Gb/s–per–Pin Operation in 0.35–μm CMOS" by Andrea Boni, Member, IEEE, Andrea Pierazzi, and Davide Vecchi; IEEE Journal of Solid–State Circuits, vol. 36, No. 4, Apr. 2001: pp. 706–711.

"Enhanced LVDS for Signaling on the RapidIO™ Interconnect Architecture", by Brian Young; Somerset Design Center, Motorola; pp. 17–20, Mar. 2000, IEEE, 0–7803–6450–3100.

IEEE Standard for Low–Voltage; Annex A, Annex B and Annex C, 1996.

* cited by examiner

Primary Examiner—Steven J. Mottola
(74) Attorney, Agent, or Firm—Squire, Sanders & Dempsey, L.L.P.

(57) ABSTRACT

A wide input range amplifier includes a first and second stage. The first stage has first and second inputs, first and second outputs, and first, second and third voltage sources. The first stage accepts input signals having a first common mode voltage range and outputs a first output signal having a second common mode voltage range and being amplified a first amount. The second stage has first and second inputs connected to the first and second outputs of the first stage, respectively. The second stage accepts input signals having a common mode voltage in the second range and outputs a second output signal having a third common mode voltage range and being amplified a second amount.

43 Claims, 5 Drawing Sheets

WIDE COMMON MODE DIFFERENTIAL INPUT AMPLIFIER AND METHOD

CROSS-REFERENCE TO RELATED APPLICATIONS

This application claims priority from U.S. provisional application Serial No. 60/331,522, filed Nov. 19, 2001, the contents of which are hereby incorporated by reference.

BACKGROUND OF THE INVENTION

1. Field of the Invention

This invention relates to an input/output (I/O) interface circuitry for high speed integrated circuit (IC) applications. More specifically, it relates to the low voltage differential signaling input buffers that have a wide common mode input range and low power consumption.

2. Description of the Related Art

Differential drivers and receivers are well known. Differential drivers and receivers are used in many input/output (I/O) applications such as in communications, video and integrated circuits that may demand high data transfer rate. Differential drivers and receivers are used in integrated circuits (IC) for on-chip communications between circuits, chip-to-board, off-chip communications, etc.

Low-voltage differential signaling (LVDS) technology was developed in order to provide a low-power and low-voltage alternative to other high-speed I/O interfaces specifically for point-to-point transmissions, such as those used in a network devices within data and communication networks. LVDS can be implemented in IC's to overcome some deficiencies with previous I/O interface circuitry.

In conventional I/O designs, high-speed data rates are accomplished with parallel I/O structures, where each I/O device typically has a limited bandwidth. As bandwidth is increased, more I/O devices are required to achieve the increased bandwidth. Over the years, bandwidth has increased substantially leading to massive parallelism in I/O designs in IC's and require more power. As a result, these parallel I/O structures occupy more and more space on IC's. This complicates the design of the circuits because there is less space available on the chip and increases the cost of such IC's because of the additional power required because of the numerous extra pads, current sources, etc. necessary in a parallel structure. Thus, most existing I/O drivers are not power efficient.

LVDS interfaces have reduced voltage swing and can operate at very high speed with less power consumption. With differential outputs, a LVDS receiver can reject ambient common mode noise and less parallelism is needed due to the increased data rate of LVDS I/O drivers. Thus, the use of LVDS can reduce the overall cost and size of high speed ICs.

However, LVDS requires a common mode input voltage that is substantially bounded by the supply voltages. This is often referred to as a rail-to-rail input voltage. In Complementary Metal-Oxide-Semiconductor (CMOS) process, two types of transistors are available for the IC design: N-type Metal-Oxide-Semiconductor (NMOS) and P-type Metal-Oxide-Semiconductor (PMOS). An NMOS transistor is turned ON when the gate voltage (Vg) is above the source voltage (Vs) by the threshold voltage (Vtn), or when Vg−Vs>Vtn. Since Vs is typically set to ground, to turn an NMOS transistor ON, it is required to have Vg>Vtn. If Vtn is in a range of 0.4V, the transistor will be OFF if the input Vg is near ground.

A PMOS transistor is turned ON when the gate voltage is below the source voltage (Vs) by threshold voltage (Vtp), or when Vs−Vg>Vtp. Vs is typically the power supply voltage, VDD. Thus to turn a PMOS transistor ON, it is required to have Vg<VDD−Vtp. If Vtp is in a range of 0.4V, the PMOS transistor will be OFF if Vg=VDD, since Vg>VDD−0.4. Therefore, neither an NMOS nor a PMOS input stage can meet a rail-to-rail common-mode input range 0V<V<2.4V, which is specified by the LVDS standard, in IEEE Std. 1596.3-1996.

A prior art wide input range amplifier is shown in FIG. 5. The amplifier includes two input buffers B1 and B2, which may be implemented by a PMOS stage and an NMOS stage. The outputs of buffers B1 and B2 are combined in a MUX M1, which receives an input control signal from a Schmidtt trigger ANDed with the common mode voltage Vcm, via a third buffer B3. The control signal Z selects which output range to use, XP or XN. This is then input into the digital logic of the circuit.

This prior art design is complicated and takes up much space on the chip. Furthermore, the prior art design increases power consumption necessary, therefore increasing the cost of the chip or IC.

In view of the deficiencies in the prior art, there is a need for new and improved systems and methods for buffering LVDS in modern I/O applications.

SUMMARY OF THE INVENTION

According to an embodiment of the present invention, provide is a wide input range amplifier including a first and second stage. The first stage has first and second inputs, first and second outputs, and first, second and third voltage sources. The first stage accepts input signals having a first common mode voltage range and outputs a first output signal having a second common mode voltage range and being amplified a first amount. The second stage has first and second inputs connected to the first and second outputs of the first stage, respectively. The second stage accepts input signals having a common mode voltage in the second range and outputs a second output signal having a third common mode voltage range and being amplified a second amount.

According to another embodiment of the present invention, provided is a method of buffering an input signal including steps of providing a first amplifier stage for receiving an input signal having a first voltage range, amplifying the input signal a first amount, and outputting an output signal having a second voltage range being amplified said first amount. The method further includes steps of providing a second amplifier stage for receiving the output signal from said first amplifier stage, amplifying the output signal a second amount, and outputting a differential output signal having a third voltage range being amplified said second amount.

According to another embodiment of the present invention, provided is a method for receiving a signal, which includes the steps of receiving a thick device signal having a first common mode range; amplifying the thick device signal a first amount and stepping the thick device signal down to a first thin device signal having a second common mode range; and amplifying the thin device signal a second amount and outputting a second thin device signal having a third common mode voltage range.

According to another embodiment of the present invention, provided is a wide input range amplifier which includes a first and second amplifying means. The first amplifying means for accepting input signals having a first common mode voltage range and outputting a first output signal having a second common mode voltage range and being amplified a first amount. The second amplifying means for accepting input signals having a common mode voltage in the second range and outputting a second output signal having a third common mode voltage range and being amplified a second amount.

BRIEF DESCRIPTION OF THE DRAWINGS

The objects and features of the invention will be more readily understood with reference to the following description and the attached drawings, wherein.

DETAILED DESCRIPTION OF THE PREFERRED EMBODIMENTS

In a digital CMOS process, there are two types of devices in terms of gate oxide thickness. One is called a thick device and has a high threshold voltage, and another is called a thin device and has a low threshold voltage. For an example, in the 0.13$\mu$ digital process there are 2.5 V and 1.2 V devices. Thick devices are ideal for sustaining high voltage in the interface circuitry, and thin devices with low threshold devices are preferred for their high speed and lower power consumption, for digital core circuitry. Thus, one function of an LVDS input buffer (receiver) is to accept a voltage signal from outside the chip or IC, and convert the signal to 1.2 V logic for core processing.

In single ended input buffer, it is well known that duty cycle distortion can occur if rising and falling edges are not the same. This is more important in high speed data applications, where the distortion in the range of pico seconds are counted. Differential output can reduce duty cycle distortion. Thus, for high speed application, an LVDS buffer with a differential output is desired. This patent describes an LVDS input buffer with wide common-mode input range, low duty cycle distortion, and low power consumption.

Figure 1:
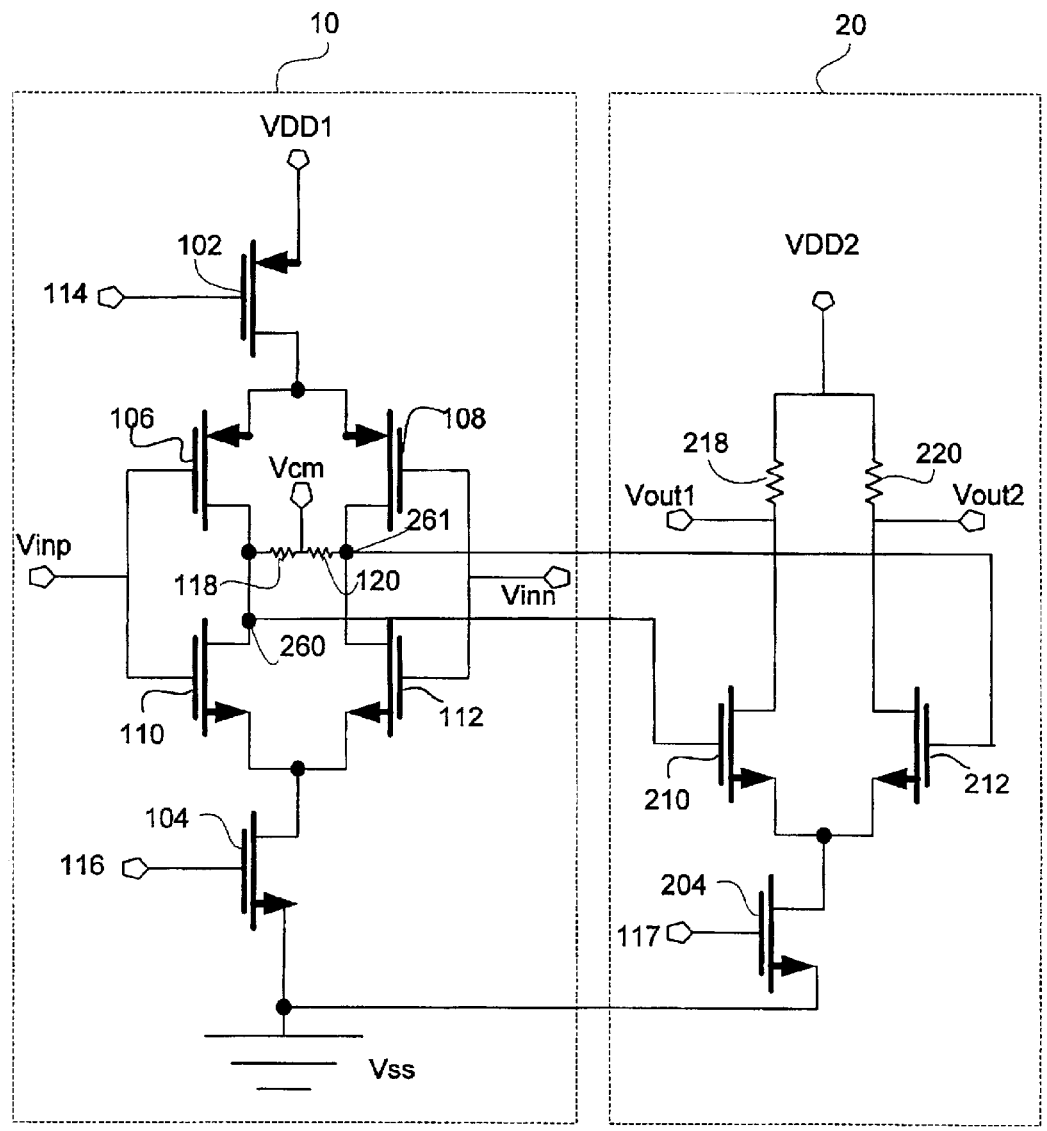
FIG. 1 is a schematic of a wide input ranger amplifier according to an embodiment of the present invention.

FIG. 1 shows a two-stage wide common mode input buffer schematic. The buffer includes a pre-amplifier 10 stage and a Current Mode Logic (CML) stage 20. A first source voltage VDD1 is a 2.5 V I/0 voltage (thick device), and a second source voltage VDD2 is 1.2 V core voltage (thin device) used for the digital core. A common mode voltage source Vcm is ideally set to (VDD1)/2, but in this case it can be 1.2 V for practical reasons.

The pre-amp stage 10 includes complementary input stages. In this embodiment, a first PMOS stage (106 and 108) and a second NMOS stage (110 and 112) are used. By applying complementary stages at the input stage, the input buffer can accept wide input common voltages.

NMOS transistor 104 provides bias current to NMOS transistors 110 and 112. NMOS transistor 104 has its gate tied to a bias control voltage 116. The gain that is generated by NMOS transistor 110 may be given by the formula:

$$Gm(110)*R(118),$$

where Gm(110) is the transconductance of NMOS transistor 110, and R(118) is the resistance of load resistor 118. Note, in a typical design, NMOS transistors 110 and 112 may have the same size and characteristics. Similarly, PMOS transistors 106 and 108, also have the same size and characteristics. Load resistors 118 and 120 act as load resistors and preferably have the same resistance. The current source is provided by PMOS 102, which has its gate tied to a bias control voltage 114.

CML stage 20 may be a differential amplifier and include a PMOS output stage. The gain generated by the CML PMOS stage is given by Gm(106)*R(118), where Gm(106) is the transconductance of transistor 106. Since the outputs of the NMOS and PMOS stage are combined at node 260 and 261, the overall differential gain is given by the equation:

$$A_D=[Gm(110)+Gm(106)]*R(118).$$

Since the output is differential, the duty cycle can be better maintained. Incoming data is supplied to input nodes Vinp and Vinn.

Common mode voltage Vcm is typically set to a voltage near the middle of voltage source VDD1. The input range is limited by the common mode voltage Vcm. In a case when Vinp and Vinn are quite high (e.g., 1.8 V–2.4 V), both PMOS transistors 106 and 108 tend to be OFF. However, the NMOS stage, NMOS transistors 110 and 112 will be ON. Similarly, when the input voltages Vinn and Vinp are both low, then both NMOS transistors 110 and 112 are OFF, and PMOS transistors 106 and 108 will remain ON Accordingly, complementary input stages achieve a wide common mode input voltage range. Although, the common-mode input range is not rail-to-rail, this embodiment of the present invention provides a simple and low cost (i.e., smaller in size and takes up less silicon area) wide input range solution.

In the second stage of the input buffer, Current Mode Logic 20, a current sink (source) is provided by an NMOS transistor 204, which is biased by a bias voltage 117. One having ordinary skill in the art will readily understand how to bias NMOS transistor 204 in a CML stage. NMOS transistors 210 and 212 provide a differential gain which can be calculated by:

$$Gm(210)*R(220)$$

to the output nodes Vout1 and Vout2; where Gm(210) is the transconductance of transistor 210, and R(220) is the resistance of resistor 220. The second stage, CML stage 20, completes the voltage level shift from VDD1 to VDD2, at which the digital core operates.

Figure 2:
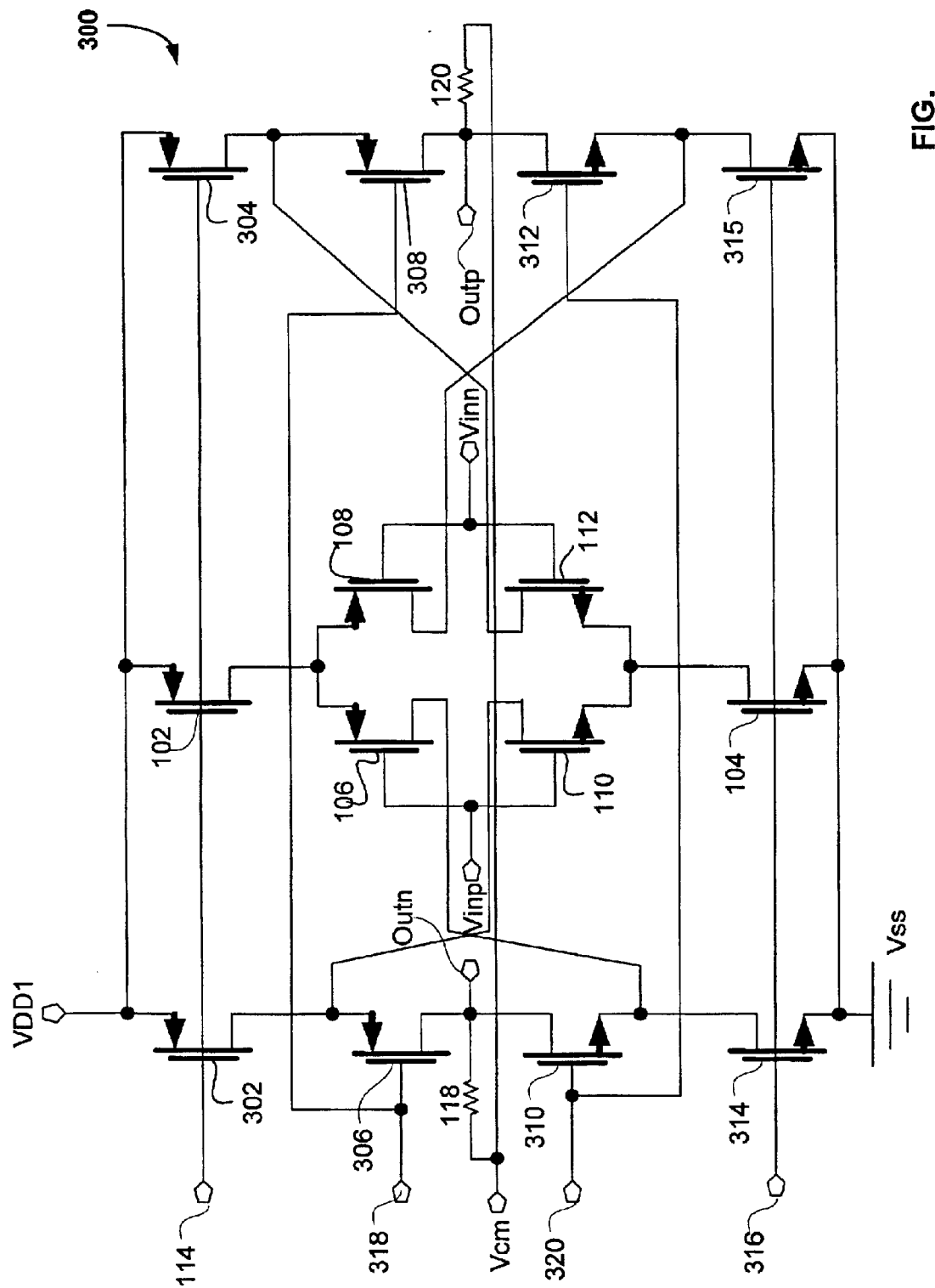
FIG. 2 is a schematic of a wide input ranger amplifier according to another embodiment of the present invention.

FIG. 2 shows the schematic of a differential receiver pre-amp with rail-to-rail common mode input range according to another embodiment of the present invention. Pre-amp 300 uses cascoded structures to fold the gain to differential resistors. To produce a wide-range differential receiver, the second stage can be a CML stage or differential amplifier, such as CML 20, shown and described with reference to FIG. 1.

Similar to the pre-amp 10 of FIG. 1, pre-amp 300 includes a complementary input pair, NMOS input stage (110 and 112) and PMOS input stage (106 and 108). Pre-amp 300 includes a current source, NMOS transistor 104 which provides bias current to the input NMOS transistor pair 110 and 112. The gate of the transistor 104 is controlled by bias control voltage 316. The inputs to the pre-amplifier 300 are Vinp and Vinn, and are connected to the gates of the input NMOS transistor pair 110 and 112 and to the gates of PMOS transistor pair 106 and 108. PMOS transistors 302 and 304 are current sources which provide proper bias current to PMOS transistors 306 and 308. The gates of transistor 306 and 308 are controlled by another bias voltage 318. The input NMOS pair 110 and 112 drive the differential resistors 118 and 120 through the cascoded transistors 306 and 308, which are cascoded with NMOS transistors 110 and 112, respectively. The load resistors 118 and 120 are also loaded to a common mode voltage Vcm. The common mode voltage may be set to near the middle of the supply voltage VDD1 or VDD1/2. For practical reasons, Vcm may be set to VDD2. The differential gain of this NMOS stage provides voltage gain of $Gm(110)*R(120)$, at output nodes Outp and Outn.

In a typical application, preamplifier 300 includes NMOS transistors 110 and 112 which can have the same size and characteristics, as do PMOS transistors 306 and 308, PMOS transistors 302 and 304, and differential resistors 118 and 120.

Similar to the NMOS input pair, the input PMOS pair 106 and 108 drive the differential resistors 118 and 120 through the cascoded NMOS transistors 310 and 312, where transistor 310 and 312 are biased from voltage 320. The bias current for the tail current 104 (current sink) is controlled by a bias voltage 316. Transistors 310 and 312 receive bias current from NMOS transistors 314 and 315, respectively. The differential gain of this stage is given by $Gm(106)*R(118)$ at nodes Outn and Outp. In a typical application, transistors 106 and 108 have the same size and characteristics, as do transistors 310 and 312, and transistors 314 and 315. Since the output of NMOS stage and PMOS stage are combined at nodes Outn and Outp, the gain (Av) for the PMOS stage and NMOS stage can be summed by the equation:

$$Av=[Gm(110)+Gm(106)]*R(118).$$

However, the gain will depend on the input common mode range. When input voltages are near the supply voltage, only NMOS transistor pair (110, and 112) is ON, and the differential gain is reduced to $$Gm(110)*R(118),$$

since not current in 106 and 108 and $Gm(106)=0$. When input common mode is very low or near ground, only PMOS transistor pair (106 and 108) will be ON. The gain may be given by $$A_D=Gm(106)*R(118),$$

since $Gm(110)=0$.

The common mode input voltage range can be designed in the following manner. When the inputs Vinp and Vinn are very high, only NMOS transistor pair 110 and 112 will be ON. To have NMOS transistors 110 and 112 in the saturation region, it is required to maintain:

$$Vd(110)-Vs(110)>Vg(110)-Vs(110)-Vtn,$$

where Vd(110) is the drain voltage (all referenced to ground (VSS)) for NMOS 110, Vs(110) is the source voltage, Vg(110) is the gate voltage, and Vtn is the threshold voltage of the NMOS transistor. Thus, to achieve an input range as high as VDD1, i.e., Vg=VDD1, transistors 306 and 308 should be biased through the bias voltage 318, so that Vd of transistors 110 and 112 are greater than (VDD1−Vtn).

When the input is low (i.e., near ground), only transistors 106 and 108 will be ON. To maintain the transistor pair 106 and 108 in the saturation region, it is required to maintain:

$$Vs(106)-Vd(106)>Vs(106)-Vg(106)-Vtp,$$

where Vs(106) is the source voltage referenced to ground VSS, Vd(106) is the drain voltage, Vg is the gate voltage, and Vtp is the threshold voltage for PMOS transistor 106. At worst, when input is as low as VSS, $Vg(106)=0$, and Vd(106) must be less than Vtp. This can be met by bias transistor 310 and 312 through the bias voltage 320.

Figure 3:
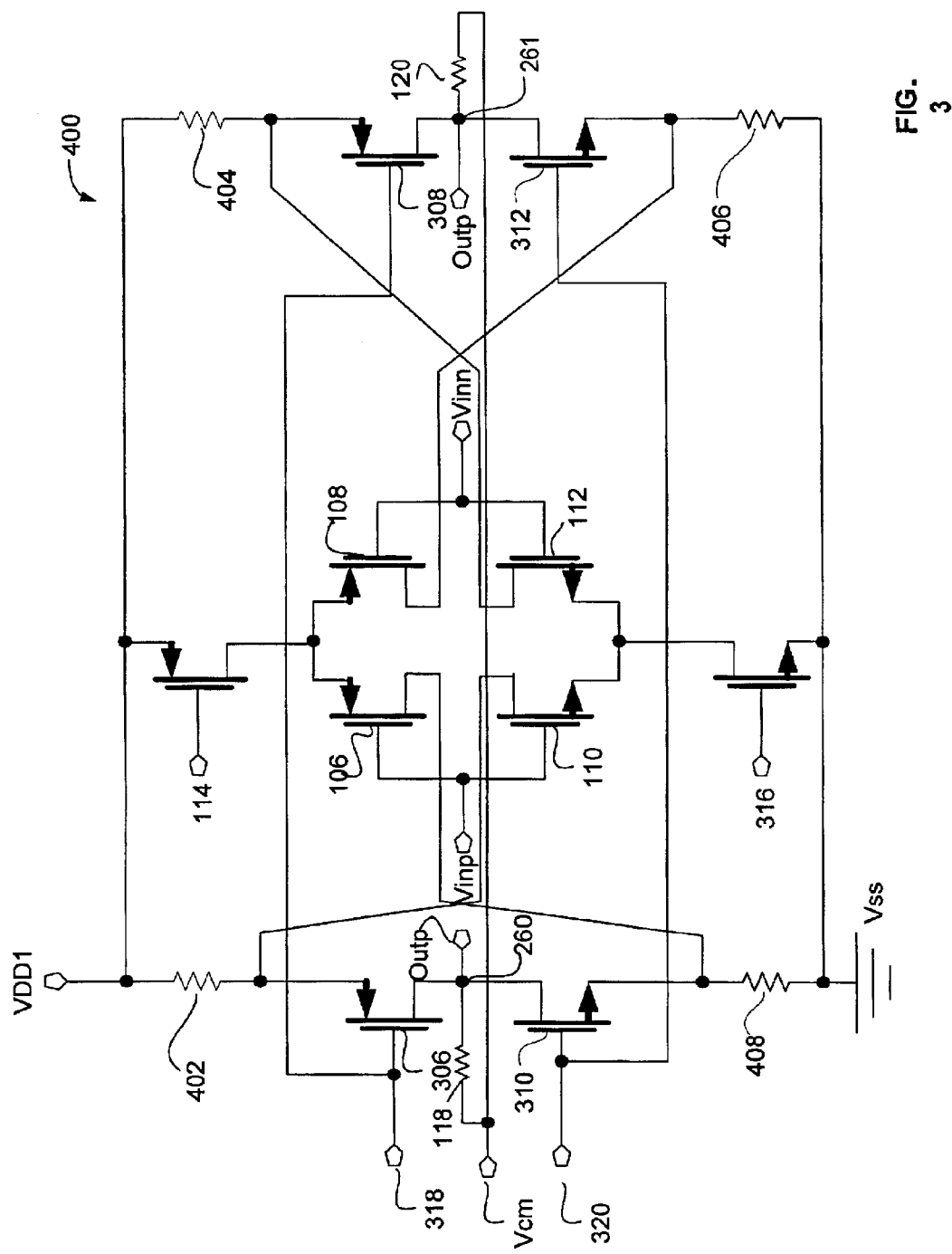
FIG. 3 is a schematic of a wide input ranger amplifier according to another embodiment of the present invention.

FIG. 3 shows another embodiment of a pre-amplifier with rail-to-rail common mode input voltage range according to the present invention. Similar to the embodiment of FIG. 2, the second stage of the amplifier can be a current mode logic CML stage or differential amplifier as shown and described with reference to FIG. 1. The embodiment is very similar to the embodiment of FIG. 2. The main difference from the schematic of FIG. 2 is that the current source transistors 302, 304, 314, and 315 are replaced with resistors 402, 404, 406, and 408. The operation of the circuit is very similar to that in FIG. 2, but the overall gain is reduced since the resistors 402–408 introduce load on the input pairs. In a typical implementation, the resistance of resistors 402–408 may be equal. When the resistance of resistor 402 is significantly greater than $1/Gm(306)$ and the resistance of resistor 404 is significantly greater than $1/Gm(308)$ (the transconductor of transistor 308), the voltage gain will be close to $$Av=[Gm(110)+Gm(106)]*R(118)$$

Thus, according to the present invention, provided are a wide input stage buffers which perform level shifting from a high (I/O voltage) voltage to low voltage (digital core voltage). The buffer of the present invention includes a pre-amp stage and a differential amplifier stage. The differential output reduces duty cycle distortion. The wide input range pre-amp stages use complementary input pairs to accept wide input ranges. Cascoded stages may be used to improve input range.

Figure 4:
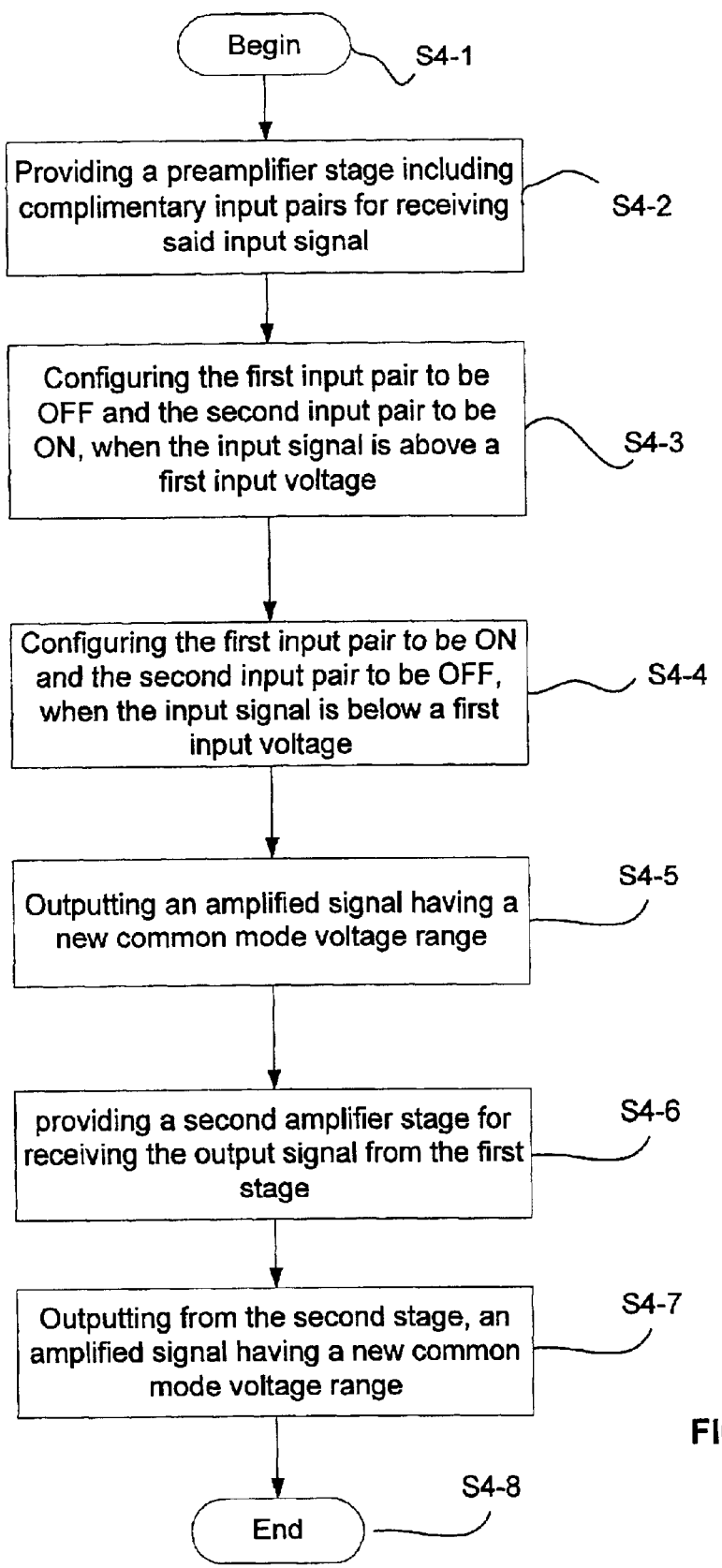
FIG. 4 is a flowchart of a method for amplifying a wide range input signal according to another embodiment of the present invention.
Figure 5:
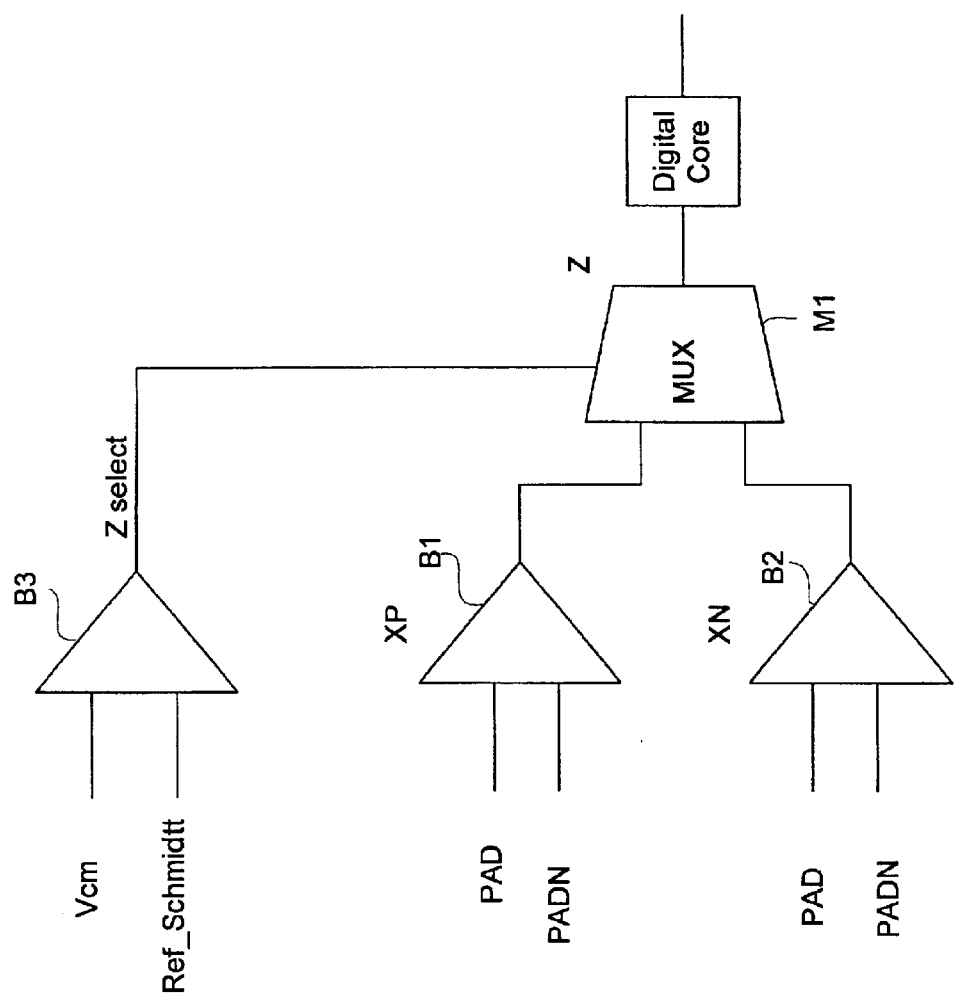
FIG. 5 is a block diagram of a prior art wide input range amplifier.

FIG. 4 is a flowchart of a method for receiving a wide input range input signal and stepping it to core voltage according to an embodiment of the present invention. The process begins at step S5-1. At step S5-2, a pre-amplifier (first stage) including complementary input stages, is provided. At steps S4-3 and S4-4, the complementary input stages may be configured such as described above with references to FIGS. 1–3. For example, the input stages may include a PMOS pair and an NMOS pair, only one of which will be on for a given voltage range. Each transistor of the input pairs may be cascoded in order to fold the gain to load resisters, as described with reference to FIGS. 2–3. The pre-amplifier stage may configured to provide a gain to an input signal and also to reduce the common mode voltage range, so that an amplified output signal may be output at step S4-5 having an improved voltage range. The input signal may be within the LVDS standard range.

Next, at step S4-6, a second stage amplifier may be provided to receive the output signal from the first stage amplifier, and may be configured as described in FIG. 1. The second stage amplifier may be designed to step the signal down for use in the digital core, and reduce the common mode voltage range to a negligible range for output at step S4-7. As already described above, this can be accomplished with a CML differential amplifier.

Note that the above-described flow chart is merely exemplary and describes a method for buffering an input signal or for providing a wide common mode differential receiver. One having ordinary skill in the art will readily understand that the steps may be performed in a separate order or all at the same time.

Thus, the present invention has been fully described with reference to the drawing figures. Although the invention has been described based upon these preferred embodiments, it would be apparent to those of skilled in the art that certain modifications, variations, and alternative constructions would be apparent, while remaining within the spirit and scope of the invention. In order to determine the metes and bounds of the invention, therefore, reference should be made to the appended claims. For example, the differential resistor load can be replaced with active transistor loads or other equivalent loads.

We claim:

1. A wide input range amplifier comprising:
    a first stage having first and second inputs, first and second outputs, and first, second and third voltage sources, said first stage accepting input signals having a first common mode voltage range and outputting a first output signal having a second common mode voltage range and being amplified a first amount;
    a second stage having first and second inputs connected to said first and second outputs of said first stage, respectively, said second stage accepting input signals having a common mode voltage in said second range and outputting a second output signal having a third common mode voltage range and being amplified a second amount,
    wherein said first stage includes two input stages, said two input stages including a first inputs stage of a first conductive type and a second input stage of a second conductive type.

2. The wide input range amplifier as recited in claim 1, wherein:
    said first stage includes differential resistors loaded across said first and second outputs of said first stage, as a load of said first stage.

3. The wide input range amplifier as recited in claim 1, wherein said second stage comprises a differential amplifier.

4. The wide input range amplifier as recited in claim 1, wherein said second stage comprises a current mode logic differential amplifier.

5. The wide input range amplifier as recited in claim 1, wherein said second stage includes a common source differential amplifier.

6. The wide input range amplifier as recited in claim 1, wherein said first input stage comprises complementary input stages.

7. The wide input range amplifier as recited in claim 6, wherein said complementary input stages comprise a first input stage of a first semi-conductor type, and a second input stage of a second semi-conductor type.

8. The wide input range amplifier as recited in claim 7, wherein said first input stage comprises a P-type coupled pair biased with a first current source, and said second input stage comprises an N-type coupled pair biased with a second current source.

9. A wide input range amplifier comprising:
    a first stage having first and second inputs, first and second outputs, and first, second and third voltage sources, said first stage accepting input signals having a first common mode voltage range and outputting a first output signal having a second common mode voltage range and being amplified a first amount;
    a second stage having first and second inputs connected to said first and second outputs of said first stage, respectively, said second stage accepting input signals having a common mode voltage in said second range and outputting a second output signal having a third common mode voltage range and being amplified a second amount,
    wherein said first stage comprises a P-type common source pair connected to a first current source and an N-type common source pair connected to a second current source, and first and second differential resistors, and wherein
        said first current source is connected to said first voltage source, said second current source is connected to said second voltage source, a gate of a first transistor of said P-type common source pair being connected to said first input, a gate of a second transistor of said P-type common source pair being connected to said second input, a gate of a first transistor of said N-type common source pair being connected to said first input, a gate of a second transistor of said N-type common source pair being connected to said second input, a drain of said first transistor of said P-type common source pair being connected to said first output, a drain of said second transistor of said P-type common source pair being connected to said second output, a drain of said first transistor of said N-type common source pair being connected to said first output, a drain of said second transistor of said N-type common source pair being connected to said second input, and said pair of load resistors being connected two each other and two said first and second outputs, and said mid-point of said pair of load resistors being connected to said third voltage source.

10. The wide input range amplifier as recited in claim 9, wherein said third voltage source supplies approximately half of a voltage of said first voltage source, and said second voltage source is ground.

11. A wide input range amplifier comprising:
    a first stage having first and second inputs, first and second outputs, and first, second and third voltage sources, said first stage accepting input signals having a first common mode voltage range and outputting a first output signal having a second common mode voltage range and being amplified a first amount;
    a second stage having first and second inputs connected to said first and second outputs of said first stage, respectively, said second stage accepting input signals having a common mode voltage in said second range and outputting a second output signal having a third common mode voltage range and being amplified a second amount,
    wherein said first stage further comprises complementary first and second input pairs, first and second differential resistors, and a first and second pair of cascoded transistors, and wherein
        said first input pair is of a first semi-conductor type and said second input pair is of a second semi-conductor type, and said load resistors are loaded across said first and second outputs as load resistors.

12. The wide input range amplifier as recited in claim 11, wherein said first input pair is biased by a first current source, said second input pair is biased by a second current source, a first and second transistor of said first cascoded pair is biased by a third and fourth current source respectively, a first and second transistor of said second cascoded pair is biased by a fifth and sixth current source respectively, said first cascoded pair is cascoded to an output of said second input pair, and said second cascoded pair is cascoded to an output of said first input pair.

13. The wide input range amplifier as recited in claim 12, wherein a drain of a first transistor of said first input pair is connected to a source of a first transistor of said second cascoded pair, a drain of a second transistor of said first input pair is connected to a source of a second transistor of said second cascoded pair, a drain of a first transistor of said second input pair is connected to a source of a second transistor of said first cascoded pair, and a drain of a second transistor of said second input pair is connected to a source of a second transistor of said first cascoded pair.

14. The wide input range amplifier as recited in claim 10, wherein said first voltage source has a voltage approximately twice that of said third voltage source, and said second voltage source is ground.

15. The wide input range amplifier as recited in claim 9, wherein said first and second differential resistors comprise active load transistors.

16. The wide input range amplifier as recited in claim 11, wherein said first and second differential resistors comprise active load transistors.

17. The wide input range amplifier as recited in claim 12, wherein said third and fourth current sources each comprise a transistor of a first semi-conductor type connected to said first voltage source, and said third and fourth current sources each comprise a transistor of a second semi-conductor type connected to said second voltage source.

18. The wide input range amplifier as recited in claim 12, further comprising a first, second, third and fourth bias voltage, said first bias voltage biasing said first, third and fourth current sources, said second bias voltage biasing said first cascoded pair, aid third bias voltage biasing said second cascoded pair, and said fourth bias voltage biasing said second, fifth and sixth current sources.

19. A method of buffering an input signal, said method comprising:
providing a first amplifier stage for receiving an input signal having a first voltage range, amplifying said input signal a first amount, and outputting an output signal having a second voltage range being amplified said first amount;
providing a second amplifier stage for receiving said output signal from said first amplifier stage, amplifying said output signal a second amount, and outputting a differential output signal having a third voltage range being amplified said second amount,
wherein said providing a first amplifier stage step comprises:
providing complementary input pairs for receiving said input signal,
configuring a first input pair of said complementary input pairs to be OFF and a second input pair of said complementary input pairs to be ON, when said input signal is above a first input voltage, and
configuring said first input pair of said complementary input pairs to be ON and said second input pair of said complementary input pairs to be OFF, when said input signal is below a first input voltage.

20. The method as recited in claim 19, wherein said providing a first amplifier stage step comprises:
providing first and second differential resistors as a load across the output of said first amplifier stage.

21. The method as recited in claim 19, wherein said providing a first amplifier stage step further comprises:
providing a first cascoded pair between the output of said first amplifier stage and cascoded with an output of said second input pair, and
providing a second cascoded pair between the output of said first amplifier stage and cascaded with an output of said first input pair.

22. The method as recited in claim 19, wherein said providing complementary input pairs step comprises:
providing said first input pair being a first semi-conductor type, and
providing said second input pair being a second semi-conductor type.

23. The method as recited in claim 19, wherein said providing a second amplifier stage step comprises providing a differential amplifier for receiving said output signal from said first amplifier stage.

24. The method as recited in claim 19, wherein said providing a second amplifier stage step comprises providing a current mode logic differential amplifier for receiving said output signal from said first amplifier stage.

25. The method as recited in claim 19, wherein said providing a second amplifier stage step comprises providing a common source differential amplifier for receiving said output signal from said first amplifier stage.

26. A method of buffering an input signal, said method comprising:
providing a first amplifier stage for receiving an input signal having a first voltage range, amplifying said input signal a first amount, and outputting an output signal having a second voltage range being amplified said first amount;
providing a second amplifier stage for receiving said output signal from said first amplifier stage, amplifying said output signal a second amount, and outputting a differential output signal having a third voltage range being amplified said second amount,
wherein said providing a first amplifier stage step further comprises:
providing a P-type common source pair connected to a first current source and an N-type common source pair connected to a second current source, and first and second differential resistors,
loading said first and second differential resistors across said output of said first stage amplifier,
connecting said first current source to a first voltage source,
connecting said second current source to a second voltage source,
connecting a gate of a first transistor of said P-type common source pair to said first input,
connecting a gate of a second transistor of said P-type common source pair to said second input,
connecting a gate of a first transistor of said N-type common source pair to said first input,
connecting a gate of a second transistor of said N-type common source pair to said second input,
connecting a drain of said first transistor of said P-type common source pair to said first output,
connecting a drain of said second transistor of said P-type common source pair to said second output,
connecting a drain of said first transistor of said N-type common source pair to said first output, connecting a drain of said second transistor of said N-type common source pair to said second input, connecting said first and second differential resistors to each other and to said first and second outputs, and connecting a mid-point of said first and second differential resistors to a third voltage source.

27. The method as recited in claim 26, wherein said providing a first amplifier stage step further comprises setting said third voltage source to a voltage approximately half of that of said first voltage source, and setting said second voltage source to ground.

28. A method of buffering an input signal, said method comprising:

providing a first amplifier stage for receiving an input signal having a first voltage range, amplifying said input signal a first amount, and outputting an output signal having a second voltage range being amplified said first amount:

providing a second amplifier stage for receiving said output signal from said first amplifier stage, amplifying said output signal a second amount, and outputting a differential output signal having a third voltage range being amplified said second amount, wherein said providing a first amplifier stage step further comprises:

providing complementary first and second input pairs, said first input pair is of a first semi-conductor type and said second input pair is of a second semi-conductor type, providing first and second differential resistors connected across said output of said first amplifier stage as load resistors, and providing a first and second pair of cascoded transistors, said first pair of cascoded transistors cascoded with said second input pair, and said second pair of cascoded transistor cascoded with said first input pair.

29. The method as recited in claim 28, wherein said providing a first amplifier stage step further comprises:

biasing said first input pair with a first current source, biasing said second input pair with a second current source, biasing a first and second transistor of said first cascoded pair with a third and fourth current source respectively, and biasing a first and second transistor of said second cascoded pair with a fifth and sixth current source respectively.

30. The method as recited in claim 29, wherein said providing a first amplifier stage step further comprises:

connecting a drain of a first transistor of said first input pair to a source of a first transistor of said second cascoded pair, connecting a drain of a second transistor of said first input pair to a source of a second transistor of said second cascoded pair, connecting a drain of a first transistor of said second input pair to a source of a second transistor of said first cascoded pair, and connecting a drain of a second transistor of said second input pair to a source of a second transistor of said first cascoded pair.

31. The method as recited in claim 28, wherein said providing a first amplifier stage step further comprises:

providing said first voltage source having a voltage approximately twice that of said third voltage source, and said second voltage source is ground.

32. The method as recited in claim 28, wherein said providing a first amplifier stage step further comprises:

providing active load transistors as said first and second differential resistors.

33. The method as recited in claim 26, wherein said providing a first amplifier stage step further comprises:

providing active load transistors as said first and second differential resistors.

34. A method for receiving a signal, said method comprising the steps of:

receiving a thick device signal having a first common mode range;

amplifying said thick device signal a first amount and stepping said thick device signal down to a first thin device signal having a second common mode range; and amplifying said thin device signal a second amount and outputting a second thin device signal having a third common mode voltage range, wherein said step of amplifying said thick device signal includes steps of:

determining whether said first common mode range is above or below a threshold voltage, and amplifying said thick device signal a first amount and stepping said thick device signal down to said first thin device signal based on the determination.

35. A method for receiving a signal, said method comprising the steps of:

receiving a thick device signal having a first common mode range;

amplifying said thick device signal a first amount and stepping said thick device signal down to a first thin device signal having a second common mode range; and amplifying said thin device signal a second amount and outputting a second thin device signal having a third common mode voltage range, wherein said step of amplifying said thin device signal includes a step of adjusting gain of said thin device signal to differential transistors to produce said second thin device signal as a differential output.

36. The method as recited in claim 35, further comprising a step of outputting said differential output to a core digital system.

37. The method as recited in claim 34, wherein said steps of determining whether said first common mode range is above or below a threshold voltage, and said step of amplifying said thick device signal include using complementary input pairs, a first pair of said complementary input pairs performing said step of amplifying said thick device signal when said first common mode range is above said threshold voltage, and a second pair of said complementary input pairs performing said step of amplifying said thick device signal when said first common mode range is below said threshold voltage.

38. The method as recited in claim 35, wherein said step of adjusting gain of said thin device signal to differential transistors includes using at least one cascoded amplifier to perform said step of adjusting.

39. A wide input range amplifier comprising:

a first amplifying means for accepting input signals having a first common mode voltage range and outputting a first output signal having a second common mode voltage range and being amplified a first amount;

a second amplifying means for accepting input signals having a common mode voltage in said second range and outputting a second output signal having a third common mode voltage range and being amplified a second amount, wherein said first amplifying means includes a first input stage of a first conductive type and a second input stage of a second conductive type.

40. The wide input range amplifier as recited in claim 39, wherein:

said first amplifying means includes a differential resistor means for providing a load of said first amplifying means.

41. The wide input range amplifier as recited in claim 39, wherein said second amplifying means comprises a differential amplifying means for producing a differential signal.

42. The wide input range amplifier as recited in claim 39, wherein said second amplifying means comprises a current mode logic differential amplifying means for producing a differential signal for digital core logic.

43. The wide input range amplifier as recited in claim 39, wherein said second common mode voltage range approximate half said first common mode voltage range, and said third common mode voltage range is negligible.

* * * * *